United States Patent [19]

Argintaru et al.

[11] Patent Number: 5,023,821
[45] Date of Patent: Jun. 11, 1991

[54] DIGITAL FILTER OPERATING AT INTERMEDIATE FREQUENCY

[75] Inventors: Lazare Argintaru, Le Pre Saint Gervais; Daniel Arnassand, Cachan; Philippe Leclair, Antony, all of France

[73] Assignee: Alcatel Thomson Faisceaux Hertziens, Cedex, France

[21] Appl. No.: 173,963

[22] Filed: Mar. 28, 1988

[30] Foreign Application Priority Data

Mar. 26, 1987 [FR] France .................................. 87 04218

[51] Int. Cl.$^5$ ......................... H04B 1/16; H04B 3/06; H03H 17/00
[52] U.S. Cl. ................................... 364/602; 333/166; 364/825; 455/340
[58] Field of Search ....................... 364/724.01, 724.16, 364/724.17, 724.19, 822, 807, 602, 724.17, 825; 333/165, 166, 167, 168, 174; 455/339, 340

[56] References Cited

U.S. PATENT DOCUMENTS 4,063,200 12/1977 Mattern ............................. 333/165
4,117,541 9/1978 Ali .................................. 364/724.17
4,581,730 4/1986 Ozeki et al. ..................... 455/617 X

OTHER PUBLICATIONS

Gersho, "Charge Transfer Filtering", Proc. of the IEEE, vol. 67, No. 2, Feb. 1979, pp. 196-218.

Primary Examiner—Stephen M. Baker
Attorney, Agent, or Firm—Sughrue, Mion, Zinn, Macpeak & Seas

[57] ABSTRACT

A digital filter operating at intermediate frequency, having a transverse filter; a recursive filter; a device for storing the different coefficients of the two filters; a D-A conversion device situated at the output of this storage device; a device for addressing this storage device; and controls for the addressing device.

8 Claims, 3 Drawing Sheets

DIGITAL FILTER OPERATING AT INTERMEDIATE FREQUENCY

BACKGROUND OF THE INVENTION

The invention provides a digital filter operating at intermediate frequency.

The information flows transmitted by microwave links may vary as whole multiples of the basic digital stream; this latter being 256 kbit/s. That is to say for example: 512, 1024, 2048, or 4096 Kbit/s etc..

Microwave transmission is optimized for each flow rate by a filter generally placed at an intermediate frequency (70 MHz very often) whose pass band is directly proportional to the data flow to be transmitted.

Depending on the data flows, filters are switched in, which may be of different kinds:
quartz or surface wave filters for small data flows,
localized constant filters for high data flows.

These techniques are unwieldly and costly in use.

The digital filters of the prior art have numerous advantages. They have a great flexibility in use due to their adaptivity and their possibility of performing non linear functions, from values of the programming coefficients;

Such filters however have drawback of comprising a structure such that delays $Z^{-1}$ appear due to the operators inherent in the operation and structural delays due to adders.

The delays TO (time operator) $Z^{-1}$ are related to the data flow : bit time. The structural delays $Z+$ appear as defects and degrade the operation of the filters.

EXAMPLE $Z^{-1}$ at 2048 Mbits $\simeq$ 500 ns.
$Z+$ at 70 MHz $\simeq$ 14.5 ns These structural delays are added together and therefore increase with the number of operators.

In the prior art,; these filters are constructed for working frequencies appreciably less than 10 MHz.

The purpose of the invention is to overcome these drawbacks.

SUMMARY OF THE INVENTION

The invention provides then a digital filter operating at intermediate frequency and comprising:
a transverse filter;
a recursive filter;
a device for storing the different coefficients of the two filters;
a D-A conversion device situated at the output of this storage device;
a device for addressing this storage device;
a means for controlling this addressing device.

Such a digital filter is adapted to the data flow and operates at intermediate frequencies.

Advantageously, the D-A conversion device receives as input the parallel outputs of the storage device, and, has its outputs connected respectively to the n inputs of the transverse filter and to the n' inputs of the recursive filter, the transverse filter having one $(n+1)$th input which is the input of the filter of the invention, the output of this transverse filter being connected to the first input of an intermediate adder, whose output, which forms the filter output of the invention, is connected to the $(n+1)$th input of the recursive filter, the output of this recursive filter being connected to the second input of the intermediate adder.

Advantageously, the transverse filter and the recursive filter have similar structures, such a structure comprising n functional delay elements RF(i) connected in series with n adders A(i), an adder being disposed at the output of each functional delay element, n structural delay elements RS(i), and n multipliers to the first input of which are connected n inputs C(i) and whose other input is connected to the last input $C(n+1)$, each structural delay element RS(i) having a first input connected to the output of the multiplier of immediately higher rank $M(i+1)$, a second input connected to the input of the functional delay element of the same rank RF(i), a third input connected to the output of the same functional delay element RF(i) and its output connected to the second input of the adder of the same rank A(i), and the first multiplier M(1) having its output connnected to the input of a first functional delay element RF(1).

Advantageously the structural delay element includes a twin gate FET transistor one of whose gates forms the first input and the second gate of which is connected to the output of a phase discriminator whose two inputs form respectively the second and third inputs of said delay element, the drain of said transistor being grounded, whereas its source is connected to a separator amplifier whose output forms the output of said delay element.

Advantageously, the functional delay element includes in series:
a sampler;
an A-D converter;
a shift register
a D-A converter;
a separator amplifier.

BRIEF DESCRIPTION OF THE DRAWINGS

The characteristics and advantages of the invention will be clear from the following description given by way of non limitative example, with reference to the accompanying Figs. in which.

DESCRIPTION OF THE PREFERRED EMBODIMENTS

A digital filter is the equivalent of a convolution integral for continuous linear systems.

So, by definition of the Z transform, we obtain the following equation:

$$S(z) = A(z) \cdot E(z) \quad A(z) \text{ being the filtering function:}$$
$$E(z) \text{ being the signal.}$$

$$S(z) = \epsilon_i \epsilon_i A_i \cdot Z^{-i} \cdot e_{n-i} Z^{-(n-i)}$$

with $A(z)$ written:

$$A(z) = \frac{\sum_{k=0}^{N} \beta k \, Z^{-k}}{\sum_{j=0}^{N} \alpha j \, Z^{-j}} \quad \text{with } \alpha o = 1$$

$\alpha j$ and $\beta k$ being the coefficients of the filter.

Figure 1:
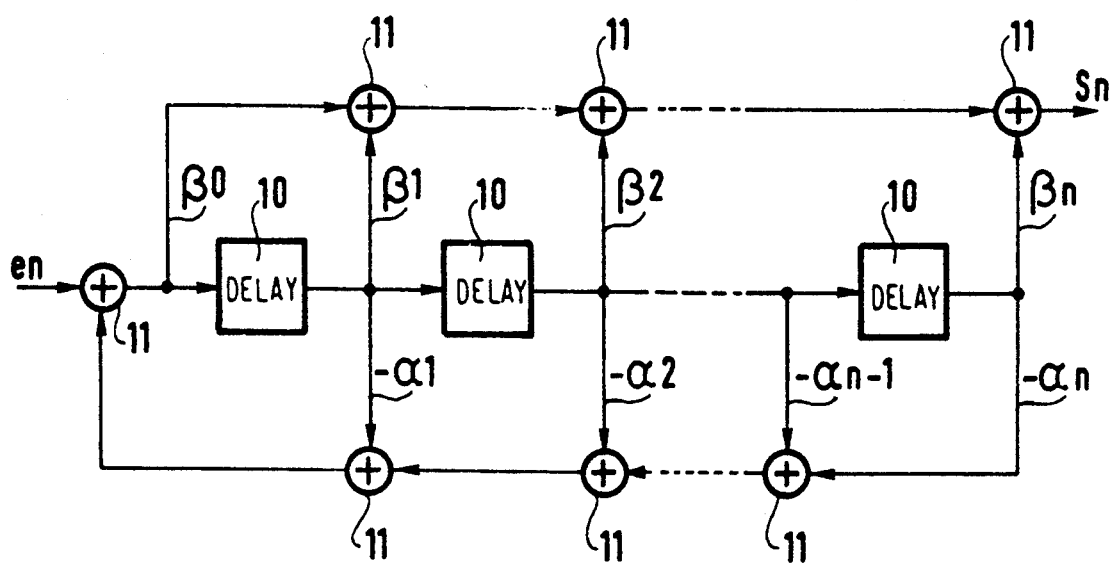
FIG. 1 is a schematical representation of a conventional digital filter.

This form by direct transcription gives in conventional form an architecture of the type shown in FIG. 1 with elements 10 corresponding to the "bit time" delays $Z^{-1}$ (or functional delays) and adders 11, $e_n$ being the input and $S_n$ the output.

To evaluate the coefficients of such filters, there exist different methods.

time filtering when the characteristics of the filter are known in time;

frequency filtering when the frequency characteristics are known;

optimal filtering which, from a template and a criterion (least square) seeks to optimize this latter.

All these methods lead to the use of an algorithm implanted in a computer for obtaining the desired phase and amplitude responses without subsequently needing to optimize these calculations on the model. Such a realization is therefore easy.

Figure 2:
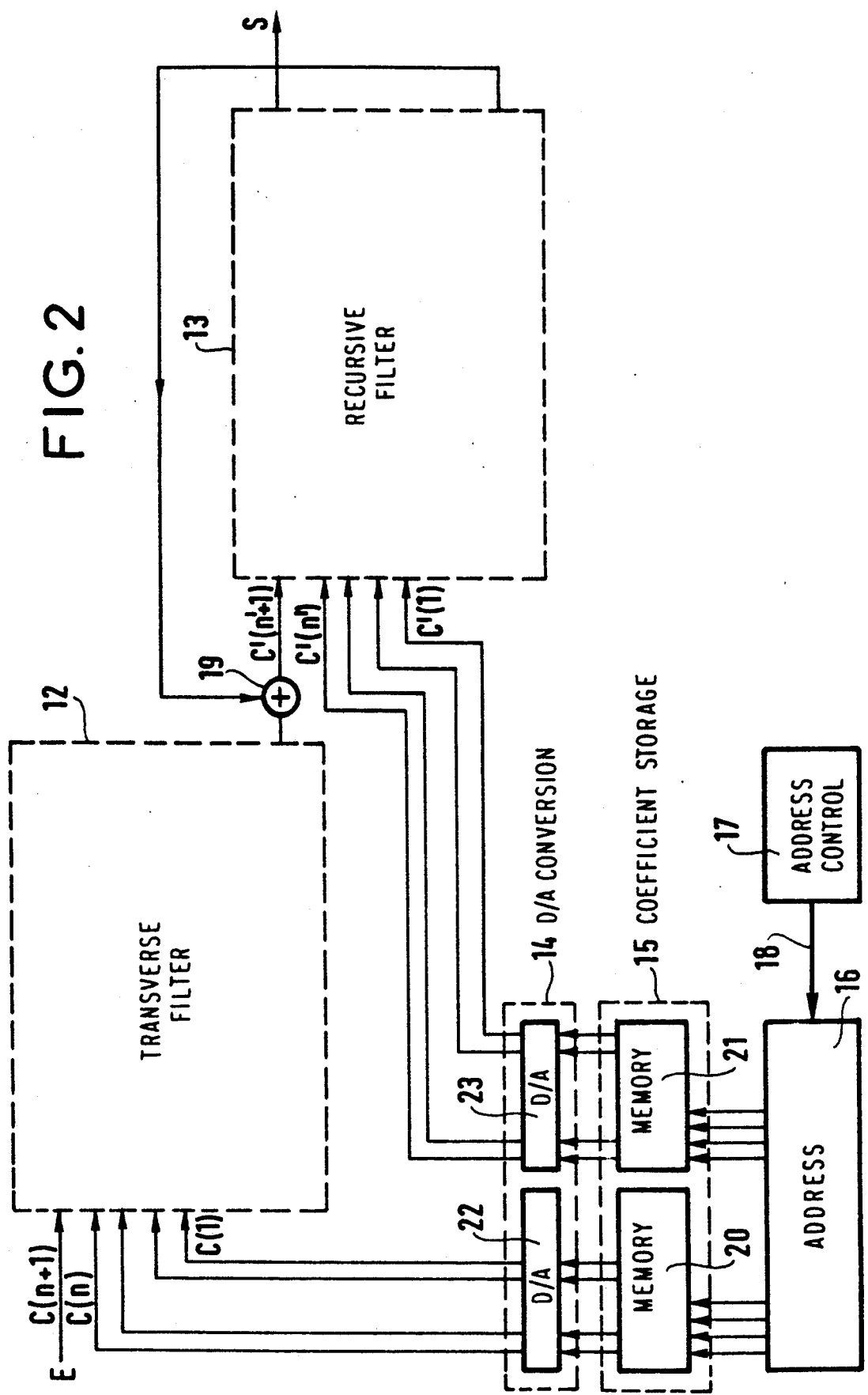
FIG. 2 is a schematical representation of the filter of the invention.

As shown in FIG. 2, the filter of the invention includes:

a transverse filter 12;

a recursive filter 13;

a device 15 for storing the different coefficients of these two filters followed by a D-A conversion device 14;

a device 16 for addressing this storage device;

a means 17 for controlling this addressing device.

The control means 17 is connected by a bus 18 to the addressing device 16, which may be a shift registers, whose outputs are connected to the storage device 15 formed for example of two memories 20, 21, PROMs for example ("Programmable Read Only Memory").

The outputs of these two memories 20, 21 are connected respectively to the n inputs $C(1) \ldots C(n)$ and to the n' inputs $C'(1) \ldots C'(n')$ of the two transverse 12 and recursive 13 filters via two D-A converters 22 and 23 for example.

The transverse filter 12 includes an additional input $C(n+1)$ which is the input E of the filter of the invention. The output of this transverse filter is connected to an intermediate adder 19 whose output, which forms the output S of the filter of the invention, is connected to an additional input $C'(n'+1)$ of the recursive filter 13.

The output of this recursive filter 13 is connected to the second input of this intermediate adder 19.

Figure 3:
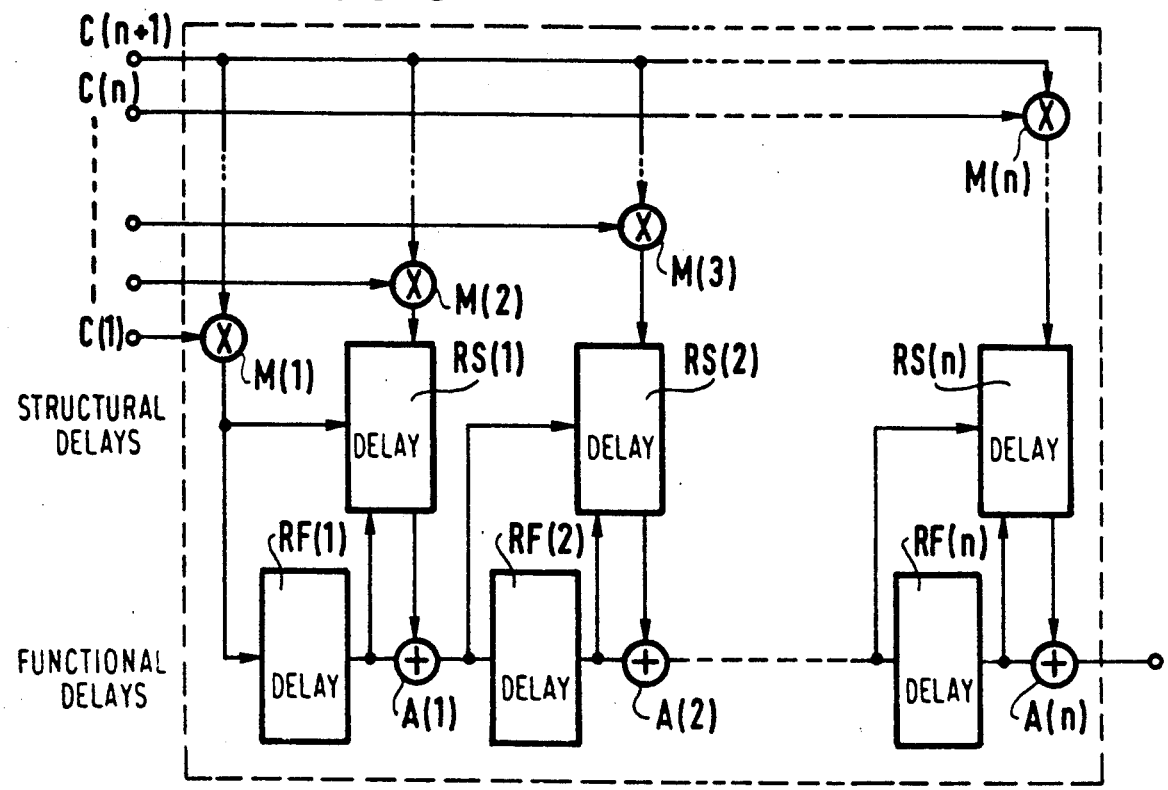
FIGS. 3; 4 and 5 are schematical representations of constituent parts of the filter of the invention shown in FIG. 2.

The transverse filter 12 and the recursive filter 13 may each have a structure such as shown in FIG. 3.

Such a structure includes n functional delay elements $RF(1) \ldots RF(n)$ in series with n adders $A(1) \ldots A(n)$, an adder $A(i)$ being disposed at the output of each delay element $RF(i)$, n structural delay elements $RS(1) \ldots RS(n)$, n multipliers $N(1) \ldots M(n)$ whose first inputs are connected to the inputs $C(1) \ldots C(n)$, and whose second inputs are connected to the input $C(n+1)$.

Each structural delay element RS (i) has a first input connected to the output of the multiplier of immediately higher rank $M(i+1)$, a second input connected to the input of the functional delay element of the same rank $RF(i)$, a third input connected to the output of the same functional delay element $RF(i)$ and its output connected to the second input of the adder of the same rank $A(i)$.

The first multiplier $M(1)$ has its output connected to the input of the first functional delay element $RF(1)$.

But each of these two filters 12 and 13 may have a number of inputs, and so a number of delay elements which is different with respect to the other one.

Figure 4:
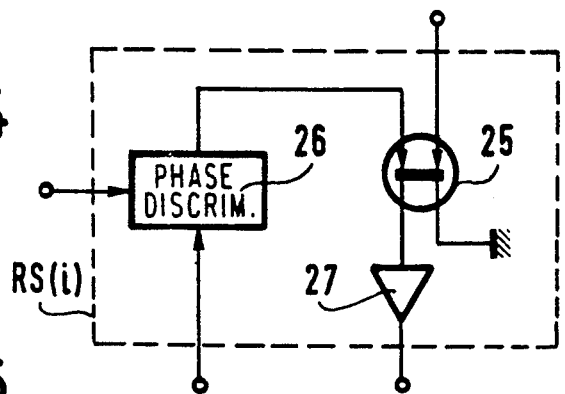

A structural delay element $RS(i)$ includes, as shown in FIG. 4, a twin gate FET transistor 25 one of whose gates forms the first input and the second gate of which is connected to the output of a phase discriminator 26 whose two inputs form respectively the second and third inputs of said element.

The drain of said twin gate transistor 25 is connected to ground, whereas its source is connected to a separator amplifier 27 whose output forms the output of said structural delay element.

Each phase discriminator compares the signals between the input and the output of a functional operator $Z^{-1}$. The error voltage is applied to the second gate of transistor 25, or a chain of twin gate FET transistors, the error signal having a phase and amplitude which will by bias variation cause the required intermediate frequency phase shift, namely a period at 70 MHz = 14.29 ns.

Figure 5:
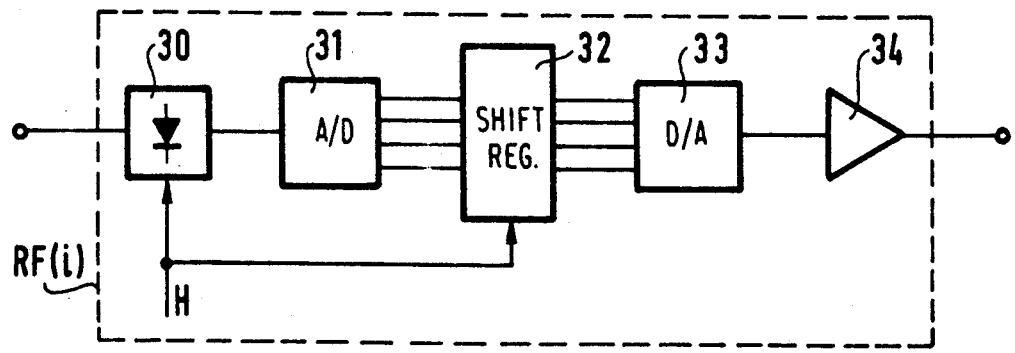

As shown in FIG. 5, the functional delay element $RF(i)$ or "bit time" delay comprises in series:

a sampler 30, for example with PIN diode;

an A-D converter 31:

a shift register 32;

a D-A converter 33;

a separator amplifier 34.

The functional delay or "bit time" delay will for example be 500 ns at 2 Mbits. It results from the association of several functions equivalent to a data acquisition chain.

In the PIN diode sampler 30, the intermediate frequency signal (FI) is chopped at a sampling frequency FS = kFI, for example FS = 10 FI.

This signal is then digitized by the A-D converter 31.

The signal from this converter 31 is coded in a number of digital states in accordance with the law $2^n$ (bits).

Thus, for example for a 6 bit 700 MHz A-D converter, the output signal will be coded over 64 states. The number of states contributes to the spectral quality of the output signal. In fact, an increase in the number of bits results in a reduction of the signal/noise ratio.

The coded signal is stored in the shift registers 32 whose size will depend on the delay to be obtained.

In the example chosen, with two Mbits and a sampling frequency of 700 MHz, the number of registers equals 500 ns/1.429 ns = 350.

This large number of elements is quite possible, the integration level of the active elements being of the order of $10^5$ to $10^6/cm^2$.

Each information is then "read" at the sampling frequency with the delay corresponding to the number of registers. The D-A conversion is then accomplished by the appropriate circuit 33. This signal is then applied to the adder 35 through the separator amplifier 34.

In the case of data flow variation, the filter of the invention is adapted by modifying the configuration of the coefficients of the two filters.

In fact, the two filters have an identical structure but their coefficients are different.

The PROM memories store the digitized coefficients of each of the two filters, which, after D-A conversion, will drive the multipliers.

These multipliers $M(i)$ may be formed from conventional transistors capable of operating at least at 70 MHz.

Addressing the memories 22 and 23 by the shift register, for identifying new coefficients, is performed for example by a microprocessor 17. The filter of the invention is differentiated then from conventional filters by the fact that each component of the spectrum to be filtered is processed separately by amplitude and phase coefficients, the assembly forming a transfer function. The phase or the functional delay is obtained by the set of elements shown in FIG. 5. Whereas in the conventional filter, the whole of the spectrum undergoes the action of the transfer function of the filter formed from passive components, self inductances and capacities, localized or not.

Any parasite delay due to the mounting degrades the operation of the filter absolutely for it is a question a contrario of the "functional delay". It is a question of the delay of the basic components: multipliers, adders, lines or connections, amplifiers, if need be, etc. . . . which has been called structural delay. This delay is compensated for at each element of the filter, more correctly at each pole, by a twin gate FET (field effect transistor) device which has the characteristic of shifting the phase of the intermediate frequency signal transisting through one of the gate-drain paths by biasing the second path, second gate-drain. The system is automated for it is convergent. The biasing level or state of the second gate is established when the phase discriminator 26 gives a zero signal at its output.

It is further possible to "cascade" or connect in series as many twin gate transistors 25 as will be necessary for obtaining the desired phase shift (a twin gate FET at frequencies of about 100 MHz can often not provide more than 30° of phase shift).

It will of course be understood that the present invention has been described and represented solely by way of preferred embodiment and that its constituent elements may be replaced by equivalent elements without for all that departing from the scope and spirit of the invention.

What is claimed is:

1. A digital filter operating at intermediate frequency, said digital filter comprising a transverse filter having coefficients, a recursive filter having coefficients, a storage device for storing the different coefficients of the two filters, a D-A conversion device situated at the output of said storage device, an addressing device for addressing said storage device and control means for controlling said addressing device, wherein each of said transverse and recursive filters includes a plurality of inputs including at last input and comprises:

a plurality of functional delay elements;

a plurality of adders connected in series with said functional delay elements, an adder being disposed at the output of each functional delay element;

a plurality of structural delay elements;

a plurality of multipliers each having first and second inputs with the first input receiving one of said plurality of filter inputs and the second input receiving the last input of the respective filter, each structural delay element having a first input connected to the output of the multiplier of immediately higher rank $M(i+1)$, a second input connected to the input of the functional delay element of the same rank and a third input connected to the output of said functional delay element of the same rank, and having an output connected to the second input of the adder of the same rank, and a first of said plurality of multipliers having its output connected to the input of a first of said functional delay elements.

2. The filter as claimed in claim 1, wherein the storage device provides parallel outputs, said transverse filter includes $n+1$ inputs and at least one output and said recursive filter includes $n'+1$ inputs and at least one output, where n and n' are integers, and wherein said D-A conversion device receives as input the parallel outputs of the storage device, and has its outputs connected respectively to n inputs of the transverse filter and to n' inputs of the recursive filter, wherein n and n' are integers, the transverse filter having one $(n+1)$th input which is the input of said digital filter, the output of said transverse filter being connected to a first input of an intermediate adder, said adder having an output which forms the output of said digital filter and which is connected to the $(n'+1\text{th})$ input of the recursive filter, the output of said recursive filter being connected to a second input of the intermediate adder.

3. The filter as claimed in claim 1, wherein each structural delay element includes at least one twin gate FET transistor having one gate forming the first input and a second gate of which is connected to the output of a phase discriminator whose two inputs form respectively the second and third inputs of said structural delay element, the drain of said transistor being grounded, whereas its source is connected to a separator amplifier whose output forms the output of said delay element.

4. The filter as claimed in claim 1, wherein each of said functional delay elements includes in series:

a sampler;

an A-D converter;

a shift register;

a D-A converter; and a separator amplifier.

5. The filter as claimed in claim 4, wherein the sampler is a PIN diode sampler.

6. The filter as claimed in claim 1, wherein the storage device includes at least one PROM (programmable read only memory).

7. The filter as claimed in claim 1, wherein the addressing device includes a shift register.

8. The filter as claimed in claim 1, wherein the control means includes a microprocessor.

* * * * *